United States Patent
Sedarat

(10) Patent No.: US 11,165,533 B1
(45) Date of Patent: Nov. 2, 2021

(54) ETHERNET OVER A REDUCED NUMBER OF TWISTED PAIR CHANNELS

(71) Applicant: Aquantia Corporation, San Jose, CA (US)

(72) Inventor: Hossein Sedarat, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 907 days.

(21) Appl. No.: 15/222,742

(22) Filed: Jul. 28, 2016

(51) Int. Cl.
| | |
|---|---|
| *H04L 1/00* | (2006.01) |
| *H04B 1/38* | (2015.01) |
| *H04L 25/03* | (2006.01) |
| *H04L 27/32* | (2006.01) |
| *H03M 13/11* | (2006.01) |
| *H03M 13/15* | (2006.01) |

(52) U.S. Cl.
CPC ............ *H04L 1/0041* (2013.01); *H04B 1/38* (2013.01); *H04L 1/0045* (2013.01); *H04L 25/03* (2013.01); *H04L 27/32* (2013.01); *H03M 13/1102* (2013.01); *H03M 13/1515* (2013.01)

(58) Field of Classification Search
CPC ..... H04L 1/0041; H04L 1/0045; H04L 25/03; H04L 27/32; H04B 1/38; H03M 13/1515; H03M 13/1102
See application file for complete search history.

(56) References Cited

U.S. PATENT DOCUMENTS

| | | | |
|---|---|---|---|
| 7,356,047 B1* | 4/2008 | Mahalawat | H04J 3/0688 370/395.5 |
| 2008/0225894 A1* | 9/2008 | Powell | H04L 12/413 370/477 |
| 2015/0171991 A1* | 6/2015 | Farjadrad | H04L 49/351 375/295 |

OTHER PUBLICATIONS

Gottfried, "10GBASE-T:10Gbit/s Ethernet over copper", NEWCOM-ACoRN Joint Workshop, Vienna, Sep. 20-22, 2006.*
Gottfried, "10GBASE-T:10Gbit/s Ethernet over copper", NEWCOM-ACoRN Joint Workshop, Vienna, Sep. 20-22, 2006 (Year: 2006).*

* cited by examiner

*Primary Examiner* — April Y Blair
*Assistant Examiner* — Rong Tang

(57) ABSTRACT

An Ethernet transceiver is disclosed. The Ethernet transceiver includes transmit circuitry having a forward error correction (FEC) encoder to encode data into FEC frames. A modulator modulates the FEC frames into symbols. A precoder equalizes the symbols and a transmitter transmits the equalized symbols over a reduced number of channels $N_S$ with respect to a baseline number of channels $N_0$. For a reduced data rate $B_S$ with respect to a baseline data rate $B_0$, the FEC frames are assembled by the FEC encoder to exhibit an expanded frame time $FT_S$ that is expanded from a baseline frame time $FT_0$ by a factor of $B_0/B_S$. The modulator generates symbols that are transmitted by the transmit circuit at a symbol rate $SR_S$ that is reduced from a baseline symbol rate $SR_0$ by a factor of $(B_0*N_S)/(B_S*N_0)$.

18 Claims, 5 Drawing Sheets

FIG. 6

| | Baud rate (MHz) | | | | | | |
|---|---|---|---|---|---|---|---|
| | 800 | 500 | 400 | 266 | 250 | 200 | 160 |
| PAM16 | | | 5 | 3.325 | 3.125 | 2.5 | 2.0 |
| DSQ128 | 10 | 6.25 | 5 | 3.325 | 3.125 | 2.5 | 2.0 |
| SQ64 (PAM8) | 8 | 5 | 4 | 2.66 | 2.5 | 2 | 1.6 |
| DSQ32 | 7.14 | 4.46 | 3.57 | 2.375 | 2.23 | 1.79 | 1.43 |
| SQ16 (PAM4) | 5.33 | 3.33 | 2.67 | 1.77 | 1.67 | 1.33 | 1.07 |

FIG. 7

| | Baud rate (MHz) | | | | |
|---|---|---|---|---|---|
| | 800 | 500 | 400 | 200 | 160 |
| PAM16 | | | 2.5 | 1.25 | 1.0 |
| DSQ128 | 5 | 3.125 | 2.5 | 1.25 | 1.0 |
| SQ64 (PAM8) | 4 | 2.5 | 2 | 1 | 0.8 |
| DSQ32 | 3.57 | 2.23 | 1.79 | 0.89 | 0.71 |
| SQ16 (PAM4) | 2.67 | 1.67 | 1.33 | 0.67 | 0.53 |

FIG. 8

| | Baud rate (MHz) | | | | |
|---|---|---|---|---|---|
| | 800 | 500 | 400 | 200 | 160 |
| PAM16 | | | 1.25 | 0.625 | 0.5 |
| DSQ128 | 2.5 | 1.5625 | 1.25 | 0.625 | 0.5 |
| SQ64 (PAM8) | 2 | 1.25 | 1 | 0.5 | 0.4 |
| DSQ32 | 1.79 | 1.12 | 0.89 | 0.45 | 0.36 |
| SQ16 (PAM4) | 1.33 | 0.83 | 0.67 | 0.33 | 0.27 | ium
ETHERNET OVER A REDUCED NUMBER OF TWISTED PAIR CHANNELS

TECHNICAL FIELD

The disclosure herein relates to communications systems, and more specifically to high-speed Ethernet systems and methods.

BACKGROUND

Much of today's modern Ethernet infrastructure is based on twisted pair copper cables that meet certain specifications. 1000BASE-T and 10GBASE-T are examples of Ethernet technologies that have default data rates of 1 Gbps and 10 Gbps, respectively. 10GBASE-T, for instance, is proven to be a very robust communication system. The architecture of many other Ethernet technologies, such as 2.5GBASE-T, 5GBASE-T, 25GBASE-T and 40GBASE-T, are derived from 10GBASE-T.

A 10GBASE-T transceiver generally includes a Tomlinson-Harashima precoder (THP) to assist with equalization, low-density parity check (LDPC) encoding for forward error correction, DSQ128 modulation, and transmit power back-off (PBO) capability to control alien crosstalk. These essential building blocks, or some slight variants of them, are used in derived technologies of 10GBASE-T as well. Other rates in standard BASE-T technology (such as 40GBASE-T, 25GBASET-T, 5GBASE-T and 2.5GBASE-T) are variants of 10G. The differences between baseline 10GBASE-T and its variants are limited primarily to different baud-rates, different LDPC framing structures or the addition of Reed-Solomon (RS) coding to the overall forward error correction (FEC) scheme. Some of these technologies may use different modulation such as PAM16. There are also non-standard variants of these technologies that may use different baud rates, modulation, framing structure, and so forth. Baseline 10GBASE-T transceivers transfer data over four twisted-pair channels.

There are, however, applications that could use the high throughputs that are supported by these technologies but on fewer twisted pairs of wire. For instance, automotive applications may require 1 Gbps of throughput over only one twisted pair channel. Another example involves residential applications that may require 1 Gbps or 2.5 Gbps of data rate over only two twisted pairs. Thus, it would be desirable to utilize proven technologies, such as 10GBASE-T, for applications that use fewer twisted-pair channels than for standard baseline 10GBASE-T applications.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 6 illustrates a table of modulation type versus baud rate for data rates using four twisted-pair channels.

FIG. 7 illustrates a table similar to FIG. 6, but for data rates using two twisted pair channels.

FIG. 8 illustrates a table similar to FIG. 7, but for data rates using one twisted-pair channel.

DETAILED DESCRIPTION

Embodiments of an Ethernet transceiver IC chip and associated methods of operation are described herein. In one embodiment, an Ethernet transceiver is disclosed. The Ethernet transceiver includes transmit circuitry having a forward error correction (FEC) encoder to encode data into FEC frames. A modulator modulates the FEC frames into symbols. A precoder equalizes the symbols and a transmitter transmits the equalized symbols over a reduced number of channels $N_S$ with respect to a baseline number of channels $N_0$. For a reduced data rate $B_S$ with respect to a baseline data rate $B_0$, the FEC frames are assembled by the FEC encoder to exhibit an expanded frame time $FT_S$ that is expanded from a baseline frame time $FT_0$ by a factor of $B_0/B_S$. The modulator generates symbols that are transmitted by the transmit circuit at a symbol rate $SR_S$ that is reduced from a baseline symbol rate $SR_0$ by a factor of $(B_0*N_S)/(B_S*N_0)$.

Figure 1:
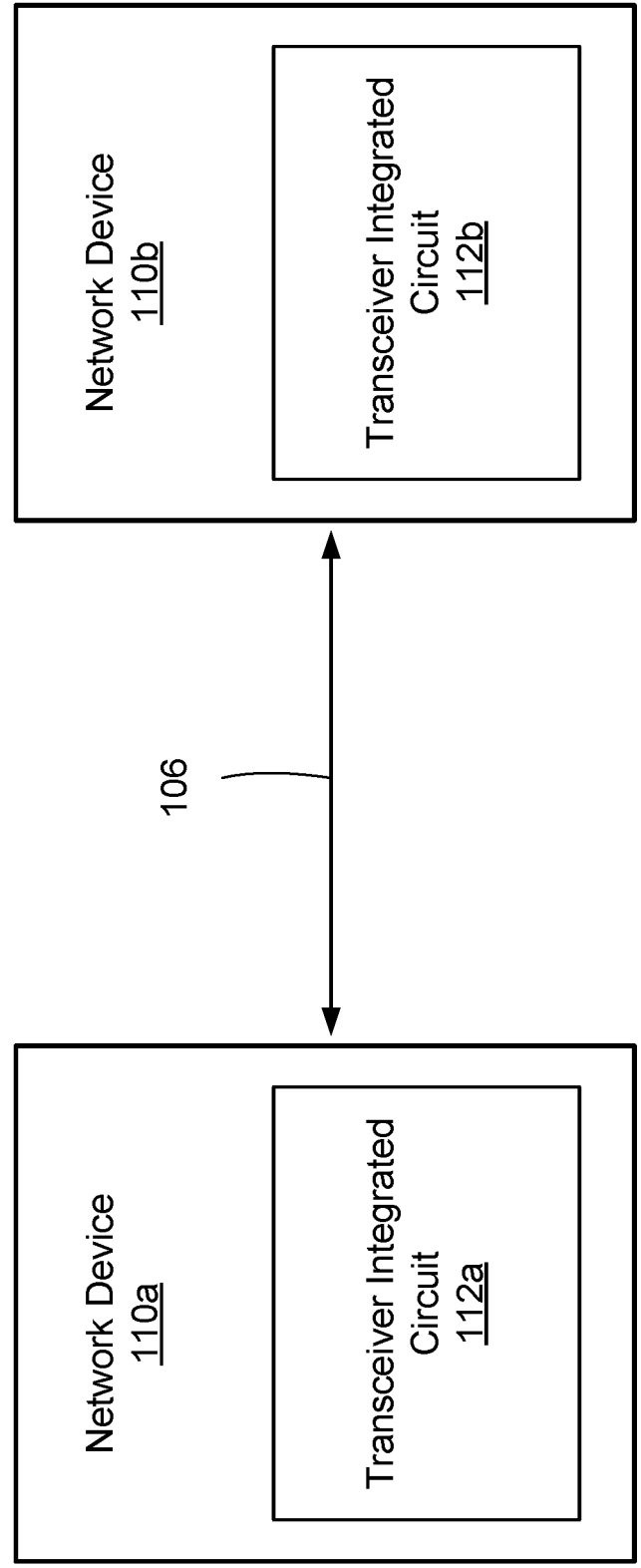
FIG. 1 illustrates a 10GBASE-T signaling link bounded by respective transceivers.

FIG. 1 illustrates a baseline 10GBASE-T architecture, with respective first and second network devices 110a and 110b communicating via transceiver circuits 112a and 112b over a link 106. The wire-level modulation for 10GBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

Figure 2:
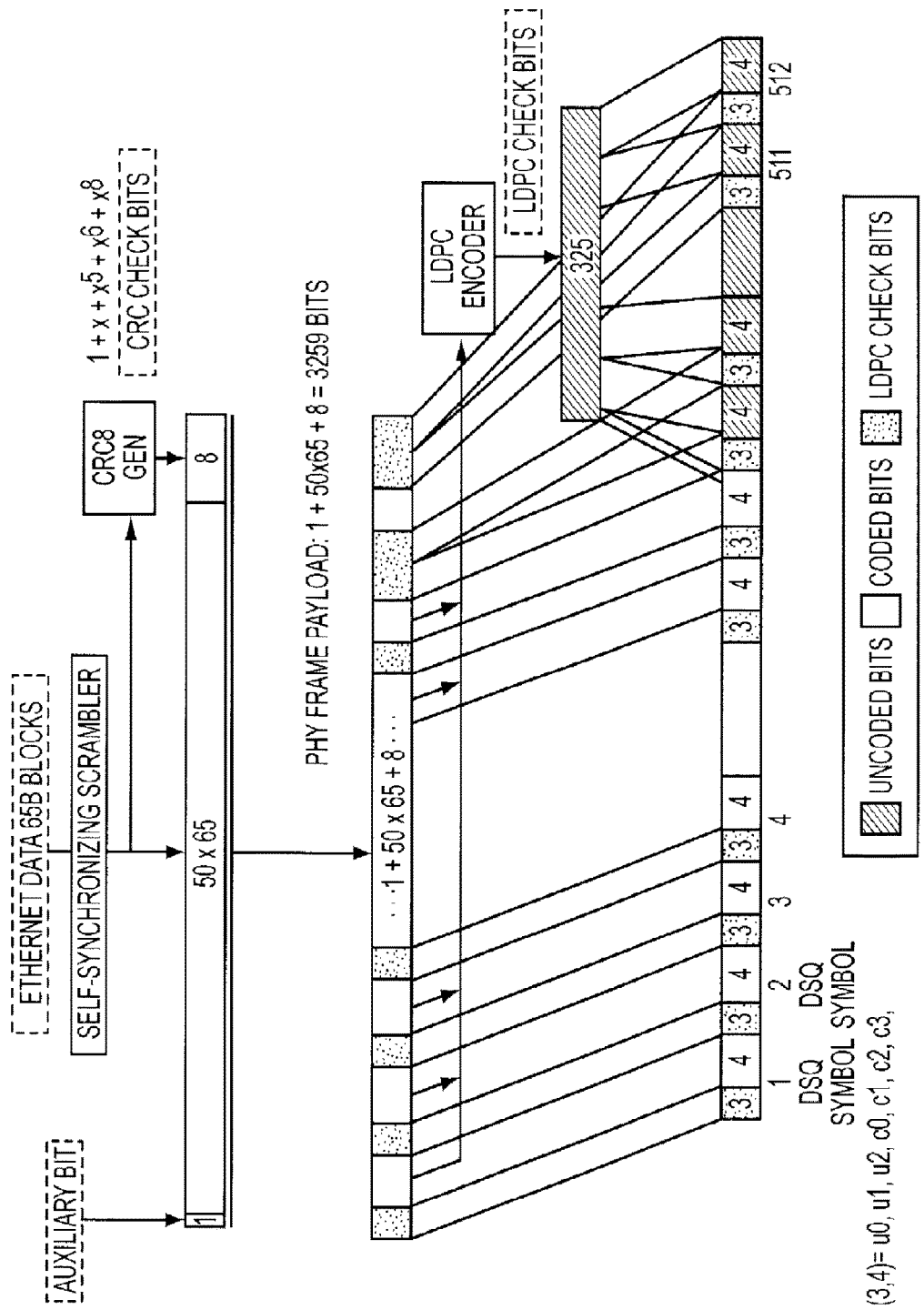
FIG. 2 illustrates a transmission frame for the 10GBASE-T communication standard.

As shown in FIG. 2, the 10GBASE-T transport frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

Figure 3:
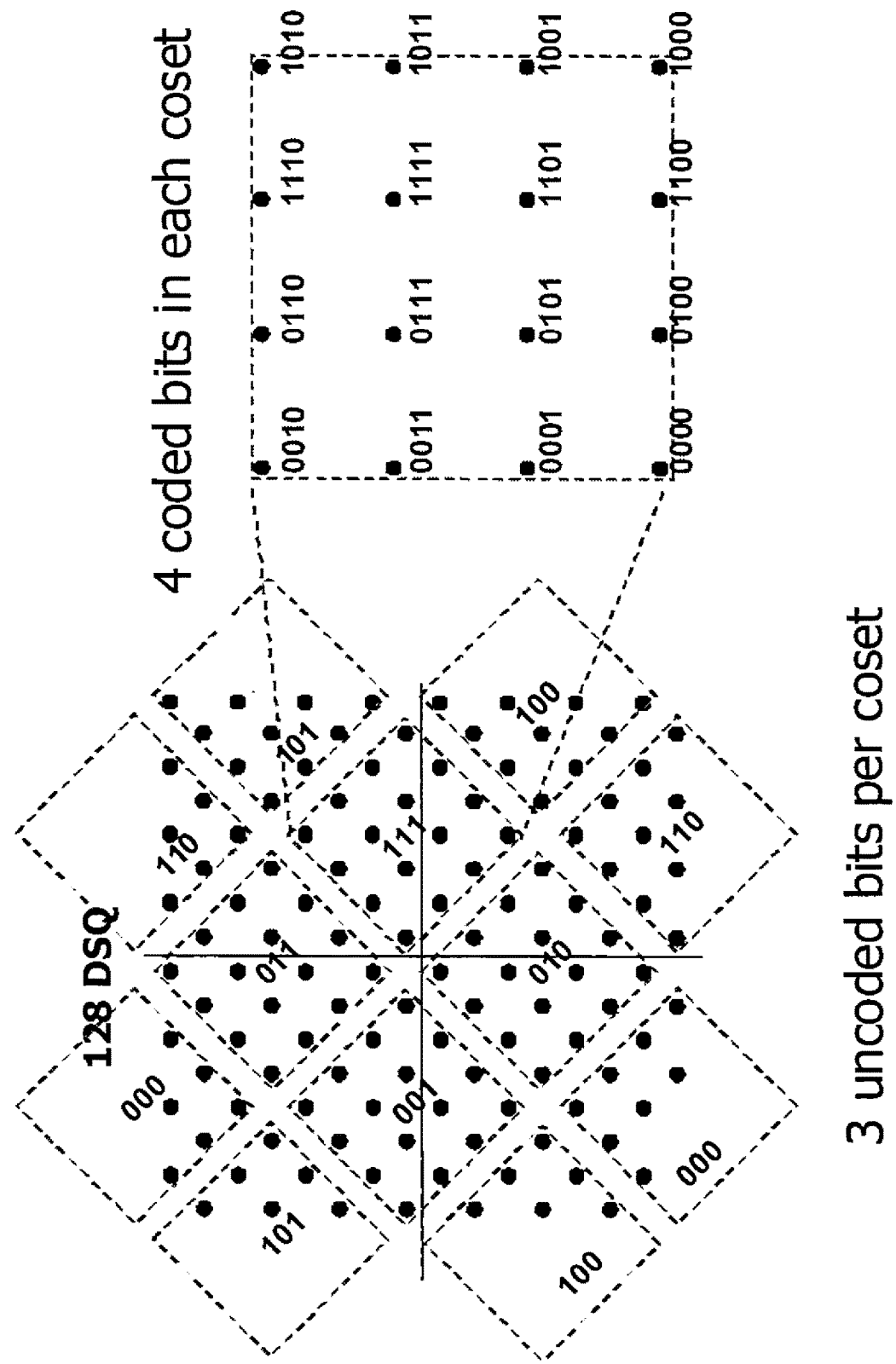
FIG. 3 illustrates a constellation for 128-DSQ modulation used in the standard of FIG. 2 and the labeling of points in a coset used with the constellation.

The resulting frame is modulated to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for 128-DSQ symbols is shown in FIG. 3, and consists of 8 cosets (regions), each coset containing 16 points. The coset label contains the 3 uncoded bits as shown in FIG. 3, and the points within the coset contain the 4 coded bits protected using the LDPC block code. The labeling of the points in the coset (the coset elements) conveying the 4 coded bits is also shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero).

While the 10GBASE-T architecture described above is suitable as one baseline mode of operation, other baseline modes may also be acceptable. For instance, baseline data rates of 5 Gbps and/or 2.5 Gbps may be supported by a baseline NBASE-T architecture that includes much of the circuitry of 10GBASE-T, but with operational variants in terms of symbol rate, modulation, and so forth.

Figure 4:
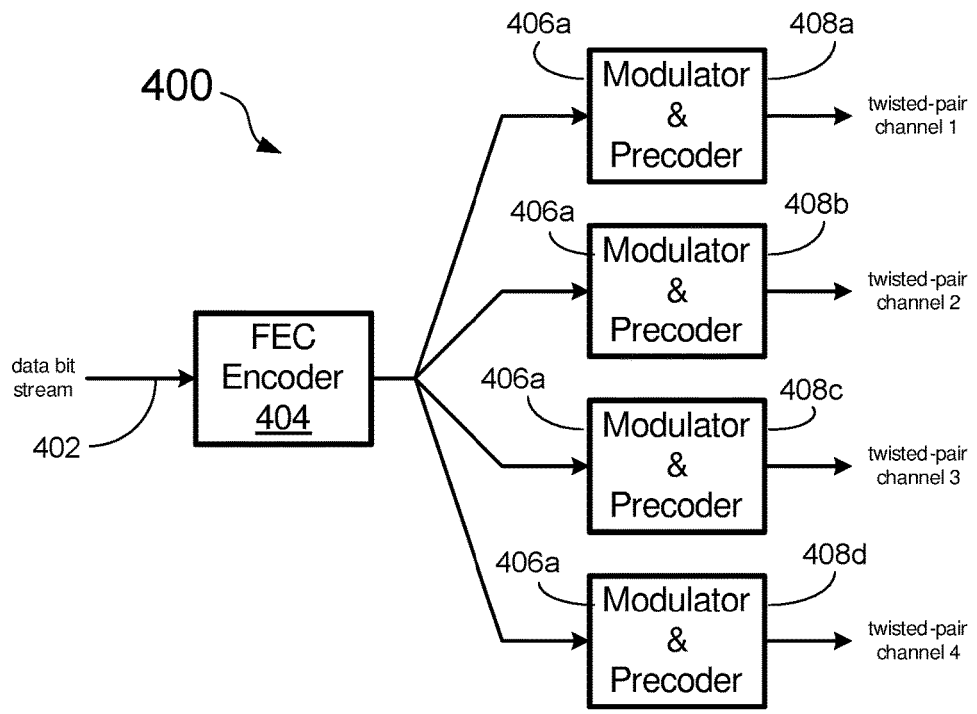
FIG. 4 illustrates a high-level transmit data path for an NBASE-T Ethernet transceiver.

FIG. 4 is a block diagram illustrating one embodiment of a transmit data path, generally designated 400, for an Ethernet transceiver that takes advantage of the robustness of 10GBASE-T, as a baseline mode of operation, but utilizing a reduced-pairs mode of operation for environments that may have less than four twisted pair channels available. The transmit data path 400 takes a data bit stream, at 402, and encodes the bit stream with a forward error correction encoder 404, such as an LDPC encoder. The encoder 404 feeds multiple modulators and precoders 406a-406d that correspond to the number of twisted-pair channels being used by the transceiver. The modulators transform the LDPC-encoded data into symbols, depending on the desired symbol-type, while the precoders equalize the symbols through, for example, THP precoding. The equalized symbols are then transmitted along the available twisted-pair channels 408a-408d.

Figure 5:
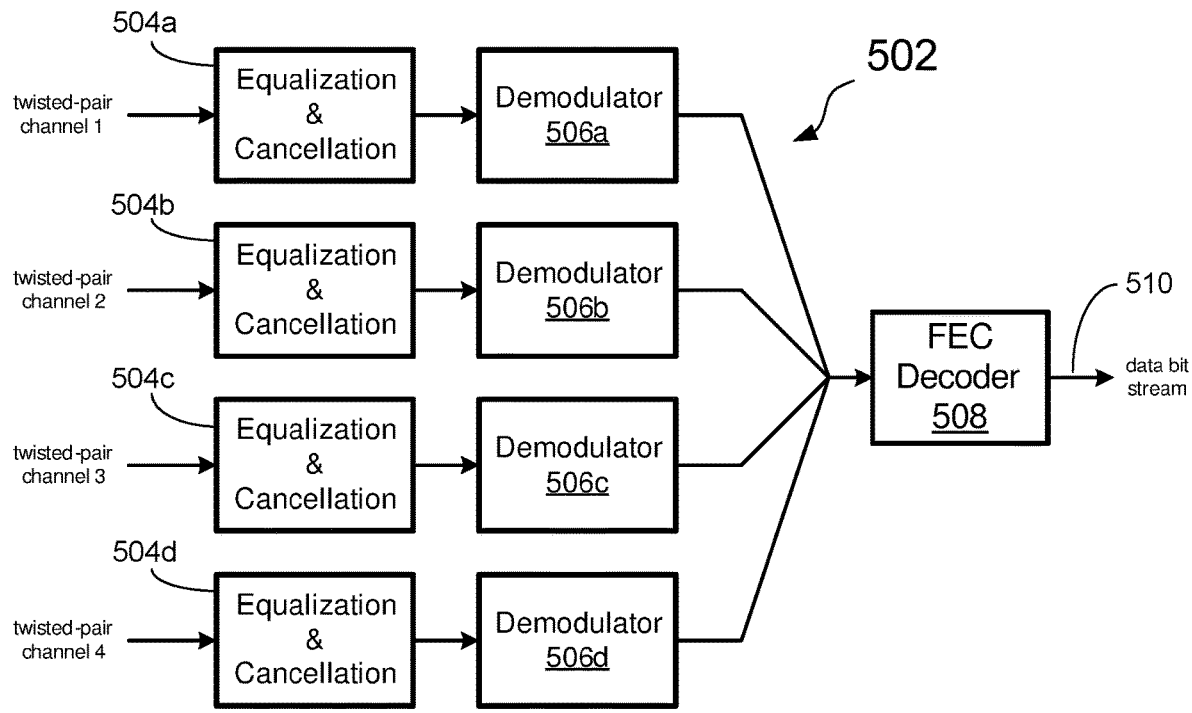
FIG. 5 illustrates a high-level transmit data path for an NBASE-T Ethernet transceiver.

FIG. 5 illustrates a block diagram for one embodiment of a receive data path, generally designated 502, for the Ethernet transceiver. The receive data path includes multiple equalization and cancellation circuits 504a-504d that correspond to the number of twisted-pair channels used, and multiple demodulators 506a-506d to demodulate the received symbols. The demodulated data is then fed to an FEC decoder 508, which generates a decoded data bit stream, at 510. For a given transceiver, the receiver data path 502 and the transmit data path 400 are each coupled to the same twisted pair channels.

In operation, and in the context of 10GBASE-T, the transmit data path 400 receives data at a net rate of 10 Gbps. The data bits are assembled in frames which are coded by the FEC encoder 404 every 320 ns. Once data is modulated and precoded, the symbols are transmitted at a baud rate of 800 MHz for each channel, with each symbol carrying 3.5 bits effectively. On the receive side, this process is reversed. The symbols are received at 800 MHz. Once echo and crosstalk are cancelled and the channel is equalized, the data is compiled in FEC frames and decoded by the FEC decoder 508 every 320 ns resulting in a final bit rate of 10 Gbps.

This transceiver architecture may be utilized with very minor changes to support fewer communication channels for a lower data rate. This may require different FEC frame rates or changes in baud rate, but the framing structure, the modulation and precoding can remain as-is. More specifically, going from $N_0$ to $N_S$ number of channels and from a data rate of $B_0$ to $B_S$, then the FEC frame time is expanded by a factor of $B_0/B_S$, and the baud rate is reduced by a factor of $(B_0 \times N_S)/(B_S \times N_0)$.

Several examples are set forth below. In one example, and starting from a baseline of 10 GBASE-T, one can reduce the number of channels from 4 to 2 to reduce the data rate to 5 Gbps. The baud rate remains at 800 MHz but the FEC frame time in this case is 640 ns, twice as long as the baseline of 10 GBASE-T. Everything else remains identical to a baseline 10 GBASE-T transceiver.

In another example, using 10 GBASE-T or 5 GBASE-T as the baseline, one can reduce the number of channels from 4 to 2 to reduce the data rate to 2.5 Gbps. Starting from a baseline of 5 GBASE-T, the baud rate remains at 400 MHz but the FEC frame time expands to twice as long as the baseline. Starting from a baseline of 10 GBASE-T, the baud rate is halved to 400 MHz and the FEC frame time expands to twice as long as the baseline.

In yet another example, using 10 GBASE-T as the baseline, one can reduce the number of channels from 4 to 1 to reduce the data rate to 2.5 Gbps. The baud rate remains at 800 MHz but the FEC frame time expands to 4 times as long as the baseline.

A further example accomplishes a data rate of 1 Gbps over two pairs of wires. Using 10 GBASE-T or 2.5 GBASE-T as the baseline, one can reduce the number of channels from 4 to 2 to reduce the data rate to 1 Gbps. The baud rate in both cases is reduced to 160 MHz. Starting from a baseline of 10 GBASE-T, the FEC frame time expands to 10 times as long as the baseline. Starting from a baseline of 2.5 GBASE-T, the FEC frame time expands to 2.5 times as long as the baseline.

Single-pair examples are explained below. Using 10 GBASE-T or 5 GBASE-T as the baseline, one can reduce the number of channels from 4 to 1 to reduce the data rate to 1 Gbps. The baud rate in both cases is reduced to 320 MHz. Starting from a baseline of 10 GBASE-T, the FEC frame time expands to 10 times as long as the baseline. Starting from a baseline of 5 GBASE-T, the FEC frame time expands to 5 times as long as the baseline.

Another single-pair example uses 10 GBASE-T or 2.5 GBASE-T as the baseline, to reduce the number of channels from 4 to 1, thereby reducing the data rate to 100 Mbps. The baud rate in both cases is reduced to 32 MHz. Starting from a baseline of 10 GBASE-T, the FEC frame time expands to 100 times as long as the baseline. Starting from a baseline of 2.5 GBASE-T, the FEC frame time expands to 25 times as long as the baseline.

Note that these examples use the baselines as defined in the IEEE 802.3 standard. As mentioned above, there are other flavors of these transceivers that may be slightly different in baud rate and modulation. For instance, there are flavors of 5G systems with other baud rates and modulations. The same scaling baud rate and frame rate applies if these systems are used as baseline in reduced pair derivatives.

FIG. 6 illustrates a table that provides examples of transceiver systems that utilize four twisted pairs of copper and may be used as a baseline for reduced-pair systems. The table identifies a data rate in terms of gigabits-per-second (such as 3.325 Gbps) resulting from a particular modulation type (such as DSQ128) at a particular baud rate (such as 266 MHz).

FIG. 7 illustrates a table with similar examples to those shown in FIG. 6, but with two-pair transceiver systems.

FIG. 8 illustrates a table with similar examples to those shown in FIGS. 6 and 7, but with single-pair transceiver systems.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '< signal name >') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An Ethernet transceiver comprising:
   transmit circuitry including
      a forward error correction (FEC) encoder to encode data into FEC frames,
      a modulator to modulate the FEC frames into symbols,
      a precoder to equalize the symbols to generate equalized symbols, and
      a transmitter to transmit the equalized symbols over a reduced number of channels $N_S$ with respect to a baseline number of channels $N_0$;
   wherein for a reduced data rate $B_S$ with respect to a baseline data rate $B_0$, the FEC frames are assembled by the FEC encoder to exhibit an expanded frame time $FT_S$ that is expanded from a baseline frame time $FT_0$ by a factor of $B_0/B_S$; and
   wherein for the reduced data rate $B_S$, the modulator generates reduced rate symbols of a reduced symbol rate $SR_S$ that are transmitted by the transmitter at the reduced symbol rate $SR_S$ that is reduced from a baseline symbol rate $SR_0$ by a factor of $(B_0*N_S)/(B_S*N_0)$.

2. The Ethernet transceiver according to claim 1, wherein:
   the baseline number of channels $N_0$ four;
   the baseline data rate $B_0$ is 10 Gbps;
   the baseline symbol rate $SR_0$ is 800 MHz; and
   the baseline frame time $FT_0$ is 320 nanoseconds.

3. The Ethernet transceiver according to claim 1, wherein the reduced number of channels $N_S$ is two.

4. The Ethernet transceiver according to claim 1, wherein the reduced number of channels $N_S$ is one.

5. The Ethernet transceiver according to claim 1, wherein ones of the reduced numbers of channels comprises a twisted-pair copper channel.

6. The Ethernet transceiver according to claim 1, wherein the symbols comprise one from the group including PAM16, DSQ128, SQ64, PAM8, DSQ32, SQ16 and PAM4.

7. The Ethernet transceiver according to claim 1, wherein the reduced rate symbols transmitted at the reduced symbol rate $SR_S$ are of the same modulation type as the symbols transmitted at the baseline symbol rate $SR_0$.

8. The Ethernet transceiver according to claim 1, wherein the reduced rate symbols transmitted at the reduced symbol rate $SR_S$ are of a different modulation type as the symbols transmitted at the baseline symbol rate $SR_0$.

9. The Ethernet transceiver according to claim 1, further comprising:
   receiver circuitry including
      a demodulator to demodulate received symbols, and
      an FEC decoder.

10. An Ethernet transceiver comprising:
    transmit circuitry including
       a forward error correction (FEC) encoder to encode data into FEC frames, a modulator to modulate the FEC frames into symbols,
a precoder to equalize the symbols to generate equalized symbols, and
a transmitter to transmit the equalized symbols over a selected number of channels;
   wherein dining a baseline mode of operation, the Ethernet transceiver operates to assemble the FEC frames to exhibit a baseline frame time $FT_0$, to transmit baseline symbols at a baseline symbol rate $SR_0$ along a baseline number of channels $N_0$ for a baseline data rate $B_0$;
   wherein during a reduced-pairs mode of operation, the Ethernet transceiver operates to assemble the FEC frames as expanded FEC frames to exhibit an expanded frame time $FT_S$, to transmit data at a reduced data rate $B_S$ by transmitting reduced rate symbols of a reduced symbol rate $SR_S$ along a reduced number of channels $N_S$;
   wherein for the reduced data rate $B_S$ with respect to the baseline data rate $B_0$, the expanded FEC frames are assembled by the EEC encoder to exhibit the expanded frame time $FT_S$ that is expanded from the baseline frame time $FT_0$ by a factor of $B_0/B_S$; and
   wherein for the reduced data rate $B_S$, the reduced symbol rate $SR_S$ is reduced from the baseline symbol rate $SR_S$ by a factor of $(B_0*N_S)/(B_S*N_0)$.

11. The Ethernet transceiver according to claim 10, wherein:
the baseline number of channels $N_0$ is four;
the baseline data rate $B_0$ is 10 Gbps;
the baseline symbol rate $SR_0$ is 800 MHz; and
the baseline frame time $FT_0$ is 320 nanoseconds.

12. The Ethernet transceiver according to claim 10, wherein the reduced number of channels $N_S$ is two.

13. The Ethernet transceiver according to claim 10, wherein the reduced number of channels $N_S$ is one.

14. The Ethernet transceiver according to claim 10, wherein ones of the reduced number of channels comprises a twisted-pair copper channel.

15. The Ethernet transceiver according to claim 10, wherein the symbols comprise one from the group including PAM16, DSQ128, DSQ64, PAM8, DSQ32, SQ16 and PAM4.

16. The Ethernet transceiver according to claim 10, wherein the reduced rate symbols transmitted at the reduced symbol rate $SR_S$ are of the same modulation type as the symbols transmitted at the baseline symbol rate $SR_0$.

17. The Ethernet transceiver according to claim 10, wherein the reduced rate symbols transmitted at the reduced symbol rate $SR_S$ are of a different modulation type as the symbols transmitted at the baseline symbol rate $SR_0$.

18. A method of operation in an Ethernet transceiver IC chip, the method comprising:
transmitting data including
   encoding data into FEC frames with an FEC encoder,
   modulating the FEC frames into symbols with a modulator,
   equalizing the symbols with a precoder to generate equalized symbols, and
   transmitting the equalized symbols over a reduced number of channels $N_S$ with respect to a baseline number of channels $N_0$;
wherein for a reduced data rate $B_S$ with respect to a baseline data rate $B_0$, the encoding includes assembling the FEC frames to exhibit an expanded frame time $FT_S$ that is expanded from a baseline frame time $FT_0$ by a factor of $B_0/B_S$; and
wherein the transmitting of the equalized symbols is carried out at a symbol rate $SR_S$ that is reduced from a baseline symbol rate $SR_0$ by a factor of $(B_0*N_S)/(B_S*N_0)$.

* * * * *